(12) United States Patent
Mimura et al.

(10) Patent No.: US 12,040,782 B2
(45) Date of Patent: Jul. 16, 2024

(54) COMPOSITE FILTER DEVICE (71) Applicant: Murata Manufacturing Co., Ltd., Nagaokakyo (JP)

(72) Inventors: Masakazu Mimura, Nagaokakyo (JP); Hiroshi Muranaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 358 days.

(21) Appl. No.: 17/557,090

(22) Filed: Dec. 21, 2021

(65) Prior Publication Data
US 2022/0116022 A1 Apr. 14, 2022

Related U.S. Application Data (63) Continuation of application No. PCT/JP2020/023074, filed on Jun. 11, 2020.

(30) Foreign Application Priority Data

Jun. 24, 2019 (JP) .................................. 2019-116417

(51) Int. Cl.
*H03H 9/56* (2006.01)
*H03H 9/13* (2006.01)
*H03H 9/205* (2006.01)

(52) U.S. Cl.
CPC .............. *H03H 9/568* (2013.01); *H03H 9/13* (2013.01); *H03H 9/205* (2013.01)

(58) Field of Classification Search
CPC .......... H03H 9/568; H03H 9/13; H03H 9/205; H03H 9/02866; H03H 9/6483; H03H 9/725; H03H 9/02559; H03H 9/64; H03H 9/145; H03H 9/25; H03H 9/72; H03H 9/14541; H03H 9/706; H03H 9/6436; H03H 9/02574; H03H 9/6406; H03H 9/70; H03H 9/0576; H03H 9/6409; H03H 9/6476; H03H 9/1092; H03H 9/6403; H03H 9/6433;
(Continued)

(56) References Cited

U.S. PATENT DOCUMENTS 10,158,341 B2 * 12/2018 Nosaka ................ H03H 9/6483
2011/0095845 A1 4/2011 Fujiwara et al.
2016/0285431 A1 * 9/2016 Nakahashi ........... H03H 9/0009
(Continued)

FOREIGN PATENT DOCUMENTS

JP 2016-184900 A 10/2016
JP 2018-011280 A 1/2018
(Continued)

OTHER PUBLICATIONS

Official Communication issued in International Patent Application No. PCT/JP2020/023074, mailed on Aug. 11, 2020.

*Primary Examiner* — John W Poos
(74) *Attorney, Agent, or Firm* — Keating & Bennett, LLP (57) ABSTRACT

A composite filter device includes a piezoelectric substrate made of $LiNbO_3$, a first filter on the piezoelectric substrate, and including acoustic wave resonators, and a second filter including one end connected in common to one end of the first filter, wherein a pass band of the second filter is in a frequency band higher than a pass band of the first filter, and bulk wave radiation frequencies of all of the first and second resonators of the first filter are higher than the pass band of the second filter.

18 Claims, 6 Drawing Sheets

(58) Field of Classification Search
CPC .. H03H 9/6489; H03H 9/605; H03H 9/02834; H03H 9/542
See application file for complete search history.

(56) References Cited

U.S. PATENT DOCUMENTS

2018/0019832 A1* 1/2018 Okuda .................... H03H 9/72
2018/0152169 A1* 5/2018 Goto ................. H03H 9/02574
2019/0123722 A1* 4/2019 Nosaka ................ H03H 9/6489

FOREIGN PATENT DOCUMENTS

WO   2009/147787 A1   12/2009
WO   2017/217197 A1   12/2017

* cited by examiner

COMPOSITE FILTER DEVICE

CROSS REFERENCE TO RELATED APPLICATIONS

This application claims the benefit of priority to Japanese Patent Application No. 2019-116417 filed on Jun. 24, 2019 and is a Continuation Application of PCT Application No. PCT/JP2020/023074 filed on Jun. 11, 2020. The entire contents of each application are hereby incorporated herein by reference.

BACKGROUND OF THE INVENTION

1. Field of the Invention

The present invention relates to a composite filter device in which one ends of respective multiple filters are connected in common.

2. Description of the Related Art

A composite filter device in which an acoustic wave filter is included is widely used in mobile communication devices, such as smartphones. For example, in an acoustic wave duplexer described in International Publication No. 2009/147787, respective ends of a first filter and a second filter are connected in common to an antenna terminal. A pass band of the second filter is set to be higher than a pass band of the first filter. The first filter is formed of a ladder filter. This ladder filter includes multiple series arm resonators each formed of an acoustic wave resonator, and multiple parallel arm resonators each formed of an acoustic wave resonator. A bulk wave radiation frequency of a series arm resonator closest to the antenna terminal among the multiple series arm resonators is set to be higher than the pass band of the second filter. Accordingly, an insertion loss of the second filter is reduced.

However, there was a case in which even when the acoustic wave duplexer according to the invention described in International Publication No. 2009/147787 was used, an insertion loss in the pass band of the second filter increased.

SUMMARY OF THE INVENTION

Preferred embodiments of the present invention provide composite filter devices each including first and second filters, the composite filter devices are each able to further reduce an insertion loss of the second filter having a relatively high pass band.

A composite filter device according to a preferred embodiment of the present invention includes a piezoelectric substrate made of $LiNbO_3$, a first filter on the piezoelectric substrate, and including multiple acoustic wave resonators, and a second filter including one end connected in common to one end of the first filter, in which a pass band of the second filter is in a frequency band higher than a pass band of the first filter, and bulk wave radiation frequencies of all of the acoustic wave resonators of the first filter are higher than a pass band of the second filter.

According to each of the preferred embodiments of the present invention, an insertion loss in the pass band of the second filter, which is higher than the pass band of the first filter, can be further reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing preferred embodiments of the present invention with reference to the drawings.

The respective preferred embodiments described in the present specification are exemplary, and partial replacement or combination of configurations between different preferred embodiments is possible.

Figure 1:
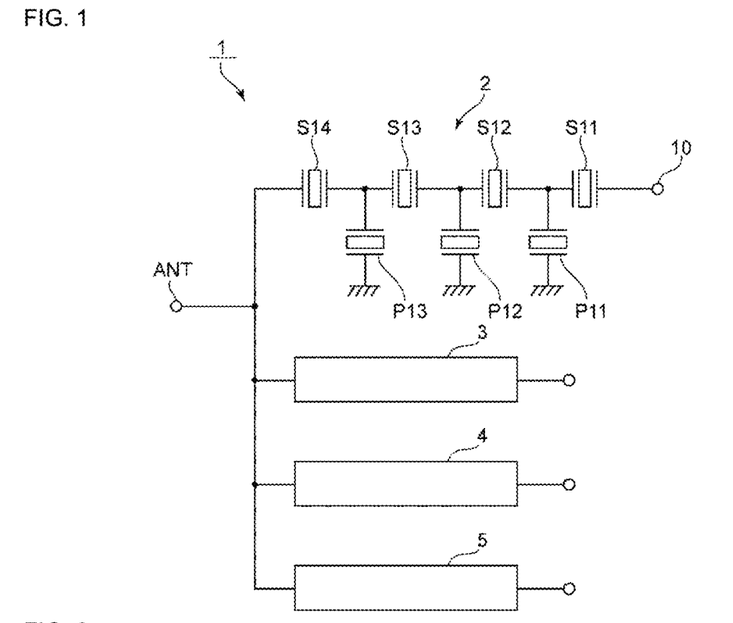
FIG. 1 is a circuit diagram of a composite filter device according to a preferred embodiment of the present invention.

FIG. 1 is a circuit diagram of a composite filter device according to a preferred embodiment of the present invention.

A composite filter device 1 is used, for example, as a multiplexer in an RF stage of a smartphone.

In the composite filter device 1, respective ends of first to fourth filters 2 to 5 are connected in common to an antenna terminal ANT. In the composite filter device 1 according to the present preferred embodiment, as long as the first filter 2 and the second filter 3 are included, the number of a plurality of the filters connected to the antenna terminal ANT is not particularly limited. That is, the number of the plurality of filters may be two or three, or may be five or more.

The first to fourth filters 2 to 5 are band pass filters. A pass band of the second filter 3 is higher than a pass band of the first filter 2.

The first filter 2 is a ladder filter including multiple acoustic wave resonators. The first filter 2 is, for example, a transmission filter including a transmission terminal 10. A series arm connecting the transmission terminal 10 and the antenna terminal ANT includes multiple series arm resonators S11 to S14. Multiple parallel arms connecting the series arm and ground potential include parallel arm resonators P11 to P13, one by one. The series arm resonators S11 to S14 and the parallel arm resonators P11 to P13 are each defined by an acoustic wave resonator.

Figure 2:
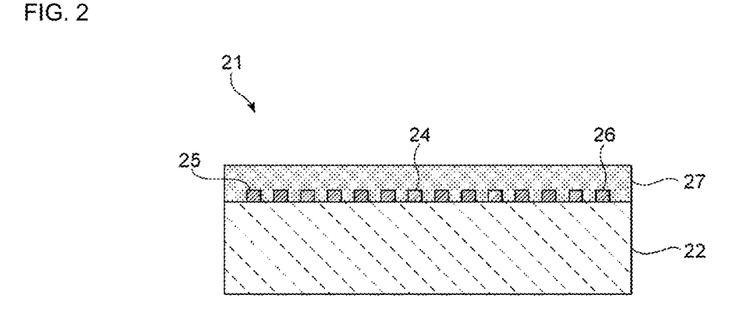
FIG. 2 is a front sectional view for explaining an acoustic wave resonator used in a preferred embodiment of the present invention.

FIG. 2 is a front sectional view for explaining an acoustic wave resonator included in a preferred embodiment of the present invention.

An acoustic wave resonator 21 includes a piezoelectric substrate 22 that is made of $LiNbO_3$, for example.

An IDT electrode 24 and reflectors 25 and 26 are provided on the piezoelectric substrate 22. Thus, a one-port acoustic wave resonator is provided.

A dielectric film 27 is laminated so as to cover the IDT electrode 24 and the reflectors 25 and 26. The dielectric film 27 is made of silicon oxide, for example. However, the dielectric film 27 may be made of a dielectric other than silicon oxide, such as $SiO_xN_y$, glass, or germanium oxide, for example.

Each of the series arm resonators S11 to S14 and the parallel arm resonators P11 to P13 in the first filter 2 illustrated in FIG. 1 is defined by such an acoustic wave resonator as the acoustic wave resonator 21.

The second filter 3 is a band pass filter, and although this configuration is not particularly limited, a frequency in the pass band is higher than the pass band of the first filter 2.

Additionally, pass bands of the respective third and fourth filters 4 and 5 are in frequency bands different from the pass bands of the respective first and second filters 2 and 3. The pass bands of the respective third and fourth filters 4 and 5 are also different from each other.

In the composite filter device 1, bulk wave radiation frequencies of all of the resonators of the above first filter 2, that is, the series arm resonators S11 to S14 and the parallel arm resonators P11 to P13, are set to frequency positions higher than the pass band of the second filter 3. Thus, an insertion loss in the pass band of the second filter 3 can be further reduced. This will be described in more detail with reference to the following example and comparative example.

As the example, the following composite filter device was provided. The first filter 2 is, for example, a transmission filter for Band 1 used in LTE, and the second filter 3 is, for example, a reception filter for Band 1.

Pass bands are, for example, described as follows.

The first filter 2; the transmission filter for Band 1, the pass band from about 1920 MHz to about 1980 MHz; and the second filter 3; the reception filter for Band 1, the pass band from about 2110 MHz to about 2170 MHz.

In the example, bulk wave radiation frequencies of all of the resonators, that is, the series arm resonators S11 to S14 and the parallel arm resonators P11 to P13, were set to frequency positions higher than the pass band of the second filter 3.

Design parameters of the resonators of the example were as follows.

The piezoelectric substrate 22: 17° Y-cut X-propagation $LiNbO_3$ substrate

The series arm resonators S11 to S14: a wavelength λ determined by electrode finger pitches=about 1.440 μm, a bulk wave radiation frequency position is at about 2799 MHz.

The parallel arm resonators P11 to P13: the wavelength λ determined by electrode finger pitches=about 1.605 μm, a bulk wave radiation frequency position is at about 2511 MHz.

In the above series arm resonators S11 to S14 and parallel arm resonators P11 to P13, a main response to be used is a response by a Love wave.

Note that, the bulk wave radiation frequency is a frequency corresponding to acoustic velocity of a slow transversal wave bulk wave of the piezoelectric substrate 22. When the wavelength determined by the electrode finger pitches of the IDT electrode is represented by λ, and the acoustic velocity of the slow transversal wave bulk wave is represented by Vb, the bulk wave radiation frequency is represented by Vb/λ. In a case of the rotated Y-cut X-propagation $LiNbO_3$ used in this example, Vb is about 4030 m/sec.

For comparison, in a composite filter device of the comparative example, a bulk wave radiation frequency of the series arm resonator S14 closest to the antenna terminal ANT was set to a frequency position higher than a pass band of the second filter 3. Bulk wave radiation frequencies of the other resonators, that is, the series arm resonators S11 to S13 and the parallel arm resonators P11 to P13, were set to frequency positions within the pass band of the second filter 3 or lower than the pass band of the second filter 3.

Design parameters of the respective resonators of the comparative example were as follows.

A piezoelectric substrate: −6° Y-cut X-propagation $LiNbO_3$ substrate

The series arm resonator S14: the wavelength λ determined by electrode finger pitches=about 1.832 μm, a bulk wave radiation frequency position is at about 2200 MHz.

The series arm resonators S11 to S13: the wavelength λ determined by electrode finger pitches=about 1.883 μm, a bulk wave radiation frequency position is at about 2140 MHz.

The parallel arm resonators P11 to P13: the wavelength λ determined by electrode finger pitches=about 1.965 μm, a bulk wave radiation frequency position is at about 2051 MHz.

Figure 4:
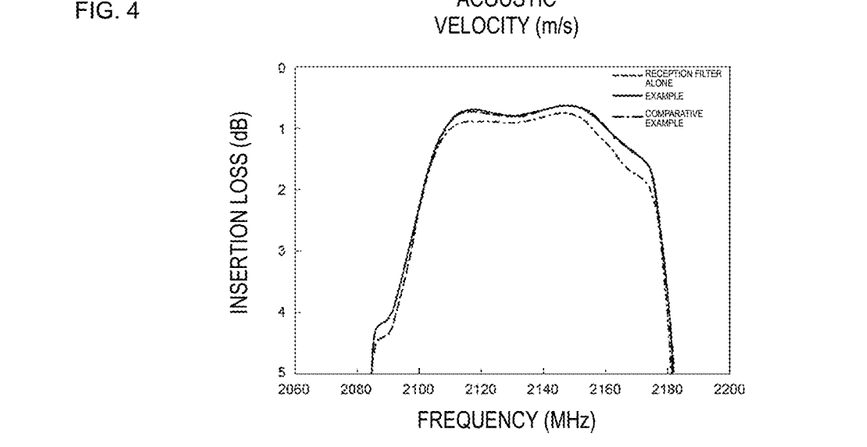
FIG. 4 is a graph showing filter characteristics of each of an example of a preferred embodiment of the present invention, a comparative example, and a filter alone.

FIG. 4 shows filter characteristics of the above example and comparative example. A solid line indicates the filter characteristics of the example, and a one dot chain line indicates the filter characteristics of the comparative example. In addition, filter characteristics of the second filter 3 alone are also indicated by a broken line. Here, the filter characteristics of the second filter 3 alone are obtained by measuring the filter characteristics of only the second filter 3 in a state where the first filter 2 is not connected to the antenna terminal.

As is clear from FIG. 4, an insertion loss in the pass band of the second filter in the composite filter device of the comparative example is larger than an insertion loss in the pass band of the second filter in the composite filter device 1 of the example. In addition, it can also be seen that the insertion loss in the pass band of the second filter in the composite filter device 1 of the example is equal or substantially equal to an insertion loss in the pass band of the second filter 3 alone. A reason for this is considered as follows.

Figure 3A:
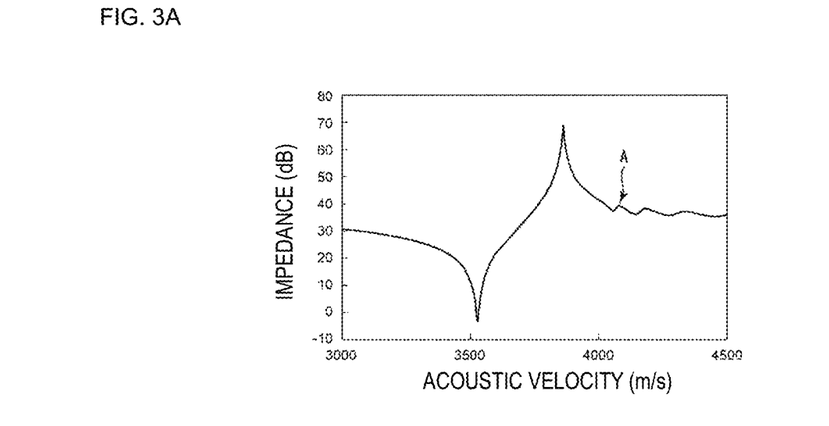
FIGS. 3A and 3B are graphs showing impedance characteristics and phase characteristics, respectively, of an acoustic wave resonator in which a rotated Y-cut X-propagation $LiNbO_3$ is used.
Figure 3B:
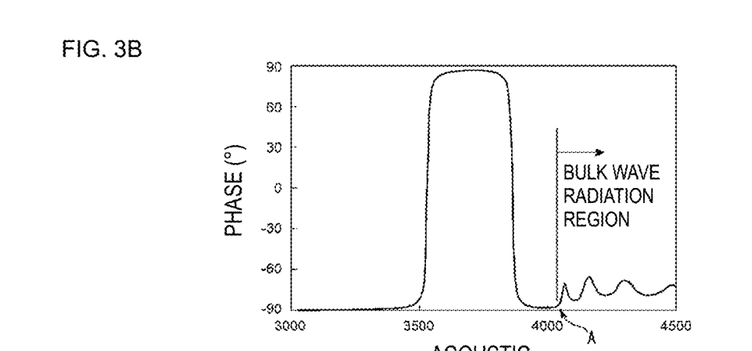

FIGS. 3A and 3B show impedance characteristics and phase characteristics, respectively, of an acoustic wave resonator in which a Love wave is used. The acoustic wave resonator is provided on a rotated Y-cut X-propagation LiNbO$_3$ substrate. In each of FIGS. 3A and 3B, a horizontal axis indicates acoustic velocity which is a product of frequency and wavelength.

As indicated by an arrow A in each of FIGS. 3A and 3B, the impedance characteristics and the phase characteristics are disturbed in a frequency range higher than an anti-resonant frequency. This disturbance is due to radiation of a bulk wave. Here, the arrow A in FIGS. 3A and 3B indicates a position of the acoustic velocity Vb corresponding to the bulk wave radiation frequency, and is about 4030 m/sec, which is acoustic velocity of a slow transversal wave bulk wave in the rotated Y-cut X-propagation LiNbO$_3$. A response due to the radiation of the bulk wave appears from the position indicated by the arrow A toward a high acoustic velocity side. It is considered that this is caused by a loss due to the radiation of the acoustic wave into the piezoelectric substrate. That is, in a frequency range higher than a frequency corresponding to the acoustic velocity of the slow transversal wave bulk wave of the piezoelectric substrate, an acoustic wave cannot be confined on a surface of the piezoelectric substrate and in a vicinity thereof, and is radiated into the piezoelectric substrate. It is considered that this causes the loss. A frequency corresponding to the acoustic velocity Vb of the slow transversal wave bulk wave of the piezoelectric substrate, that is, Vb/λ is referred to as the bulk wave radiation frequency as described above. When a material and/or a film thickness of the IDT electrode or a film thickness of the dielectric film changes, a resonant frequency or the anti-resonant frequency changes, but the bulk wave radiation frequency is determined only by the piezoelectric substrate and the wavelength λ determined by the electrode finger pitches, and thus does not change. That is, an interval between the resonant frequency or the anti-resonant frequency and the bulk wave radiation frequency varies depending on the material and/or the thickness of the IDT electrode.

When signals in the pass band of the second filter 3 are inputted from the antenna terminal ANT, which is a common terminal, some of the signals also reach the resonator of the first filter 2. When the bulk wave radiation frequencies of the series arm resonators S11 to S14 and the parallel arm resonators P11 to P13 of the first filter 2 are in a pass band of the second filter 3 or in a frequency range lower than the pass band of the second filter 3, some of signals in the pass band of the second filter 3 leak as a bulk wave in the resonator of the first filter 2. Thus, an insertion loss in the pass band of the second filter 3 is deteriorated.

In the comparative example, since the bulk wave radiation frequency of the series arm resonator S14 closest to the antenna terminal ANT is located at a position higher than about 2110 MHz to about 2170 MHz which is the pass band of the second filter 3, a loss in the pass band of the second filter 3 due to bulk wave radiation in the series arm resonator S14 does not occur. However, the bulk wave radiation frequencies of the other series arm resonators S11 to S13 and the parallel arm resonators P11 to P13 are in the pass band of the second filter 3 or in a frequency range lower than the pass band of the second filter 3. Thus, it is considered that the insertion loss is deteriorated as described above.

On the other hand, in the above example, the bulk wave radiation frequencies of all of the resonators, that is, the series arm resonators S11 to S14 and the parallel arm resonators P11 to P13 are in the frequency range higher than the pass band of the second filter 3. Thus, the insertion loss in the pass band of the second filter 3 can be reduced.

In the comparative example, the series arm resonator S14 closest to an antenna end and the other series arm resonators S11 to S13 may be significantly different in wavelength, and different in resonant frequency as well. That is, since the resonant frequency of the series arm resonator S14 may be located on a high-frequency side with respect to the pass band of the first filter, there is also a problem that the characteristics of the first filter are likely to deteriorate. On the other hand, in the example, a ratio between the resonant frequency and the bulk wave radiation frequency is increased as described later. Thereby, the resonant frequencies of all of the series arm resonators can be made close to each other, and arranged within the pass band of the first filter 2. Thus, the characteristics of the first filter 2 are further less likely to deteriorate.

The first filter 2 and the second filter 3 may be provided on the same piezoelectric substrate, and the second filter 3 may be provided on a piezoelectric substrate separate from the piezoelectric substrate on which the first filter 2 is provided. Further, the second filter 3 may be a filter without including a piezoelectric substrate, or may be a filter without including an acoustic wave, such as an LC filter, for example.

As illustrated in FIG. 1, in addition to the first filter 2 and the second filter 3, at least one other filter, such as the third and fourth filters 4 and 5, for example, may be connected in common to the first and second filters 2 and 3. In this case, in the composite filter device 1, it is preferable that at least three filters are connected in common, and the pass band of the second filter 3 is located on a highest frequency side in the pass bands of all of the filters. In this case, deterioration in an insertion loss due to bulk wave radiation of the first filter 2 is unlikely to occur in filters other than the first and second filters 2 and 3.

Further, in a configuration in which, in addition to the first and second filters 2 and 3, at least one other filter is connected in common to the first and second filters 2 and 3, and at least three filters are connected in common, the pass band of the first filter 2 may be the lowest in the pass bands of all of the filters.

In a composite filter device according to a preferred embodiment of the present invention, a ratio of a bulk wave radiation frequency to a resonant frequency is preferably about 1.4 or more, for example, in a resonator having the lowest resonant frequency among the plurality of resonators of the first filter. It is more preferable that a ratio of a bulk wave radiation frequency to a resonant frequency is about 1.4 or more, for example, in all of the resonators of the first filter. The ratio of the bulk wave radiation frequency to the resonant frequency is preferably about 2.0 or less, for example. This is because, as will be described later, a ratio of a bulk wave radiation frequency to a resonant frequency increases as a film thickness of a main electrode increases, but when the film thickness of the main electrode becomes too large, it becomes difficult to provide an electrode or a dielectric film.

When the ratio of the bulk wave radiation frequency to the resonant frequency is about 1.4 or more, preferred embodiments of the present invention can be applied to various combinations of the first filter and the second filter. This will be described below.

In recent years, carrier aggregation (CA) has been introduced. In the carrier aggregation, band pass filters for different bands are connected in common. In an existing duplexer, a reception filter and a reception filter for the same band were connected in common. When band pass filters for different bands are connected in common, there is a combination in which frequencies in pass bands are considerably separated. Table 1 below illustrates a representative example of combinations of bands used for the carrier aggregation, and pass bands of reception bands of the respective bands.

TABLE 1

| Band on low-frequency side | | Band on high-frequency side | | Center |
|---|---|---|---|---|
| Band | Reception frequency band [MHz] | Band | Reception frequency band [MHz] | frequency ratio |
| 28 | 758 to 803 | 8 | 925 to 960 | 1.208 |
| 8 | 925 to 960 | 11 | 1475.9 to 1495.9 | 1.577 |
| 11 | 1475.9 to 1495.9 | 1 | 2110 to 2170 | 1.440 |
| 3 | 1805 to 1880 | 1 | 2110 to 2170 | 1.161 |
| 3 | 1805 to 1880 | 38 | 2570 to 2620 | 1.408 |
| 3 | 1805 to 1880 | 7 | 2620 to 2690 | 1.441 |
| 2 | 1930 to 1990 | 7 | 2620 to 2690 | 1.355 |
| 1 | 2110 to 2170 | 7 | 2620 to 2690 | 1.241 |
| 39 | 1880 to 1920 | 41 | 2496 to 2690 | 1.365 |

In the existing duplexer, a band in which a pass band for a transmission filter and a pass band for a reception filter are farthest from each other is Band 4. In Band 4, a ratio of a center frequency in the pass band for the reception filter to a center frequency in the pass band for the transmission filter was about 1.23. On the other hand, in the carrier aggregation, two band pass filters having a larger frequency ratio relationship are connected to an antenna terminal in some cases. Thus, for example, in an acoustic wave resonator used in a first filter, it is preferable to increase a ratio of a bulk wave radiation frequency to a resonant frequency, compared to the past.

For example, when the ratio of the bulk wave radiation frequency to the resonant frequency is increased to about 1.4, the present invention can be applied to a combination of band pass filters in which a center frequency ratio of the pass band is about 1.4 or less. For example, it is possible to support combinations of reception filters for Band 1 and Band 7, Band 2 and Band 7, Band 39 and Band 41, and the like. Further, when a ratio of the bulk wave radiation frequency to a resonant frequency of a main response is increased to about 1.5, it is possible to support a combination of bands having a center frequency ratio of 1.5 or less. For example, it is possible to support combinations of reception filters having Band 11 and Band 1, Band 3 and Band 38, Band 3 and Band 7, and the like. Thus, preferably, the ratio of the bulk wave radiation frequency to the resonant frequency of the main response is about 1.4 or more, for example. This will be described more specifically with reference to FIGS. 5A and 5B and FIGS. 6A and 6B.

Figure 5A:
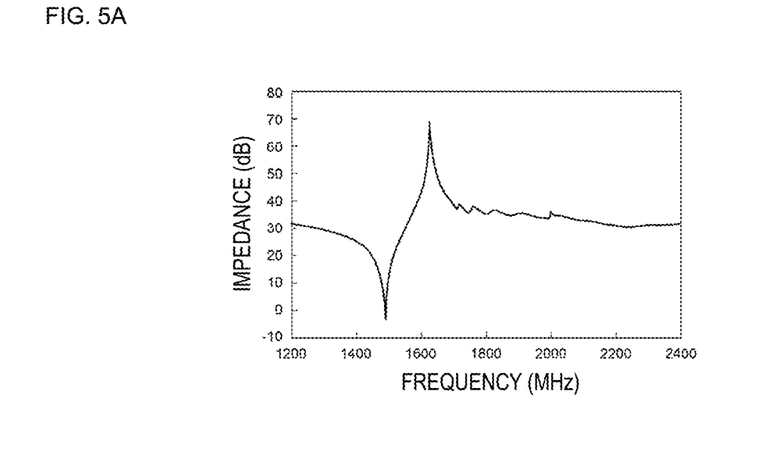
FIGS. 5A and 5B are graphs showing impedance characteristics and phase characteristics, respectively, of an acoustic wave resonator according to a reference example.
Figure 5B:
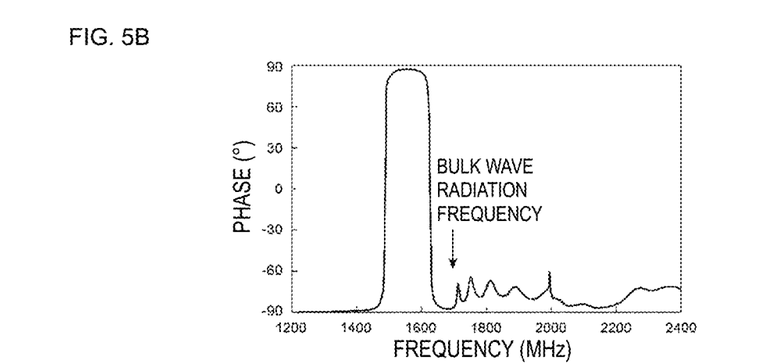

FIGS. 5A and 5B show impedance characteristics and phase characteristics, respectively, of an acoustic wave resonator using a Love wave with the following design parameters.

A piezoelectric substrate: −6° Y-cut X-propagation LiNbO$_3$ substrate.

An IDT electrode: an electrode made of Pt, a Pt film thickness=about 0.025λ

A SiO$_2$ film thickness: about 0.30λ

The wavelength λ was about 2.375 μm, for example. As an acoustic velocity of a slow transversal wave bulk wave of the above piezoelectric substrate, about 4030 m/sec, which is a value of rotational Y-cut X-propagation LiNbO$_3$, was used.

As is clear from FIG. 5A, a resonant frequency of a main response using the Love wave is about 1486 MHz. A bulk wave radiation frequency is about 1697 MHz. Thus, a frequency ratio, which is a ratio of the bulk wave radiation frequency to the resonant frequency, is about 1.142. In this case, when a first filter is a reception filter for Band 11, and a second filter is a reception filter for Band 1, and this acoustic wave resonator is used as an acoustic wave resonator of the reception filter for Band 11, the bulk wave radiation frequency is in a frequency range lower than a pass band of Band 1. Thus, there is a possibility that a loss in the second filter, which is the reception filter for Band 1, is deteriorated.

Figure 6A:
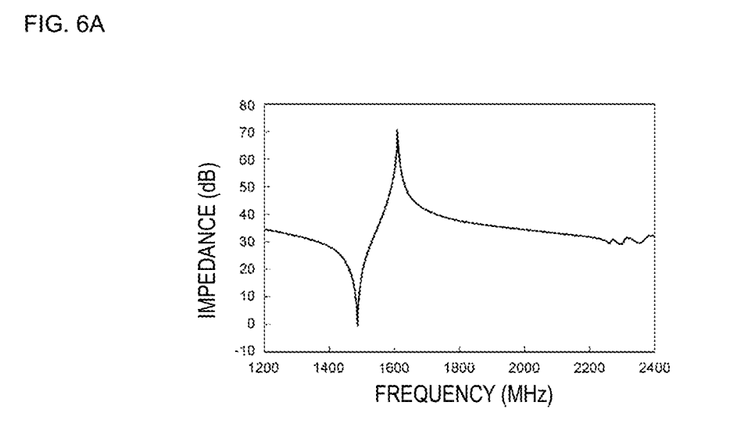
FIGS. 6A and 6B are graphs showing impedance characteristics and phase characteristics, respectively, of an acoustic wave resonator included in a preferred embodiment of the present invention.
Figure 6B:
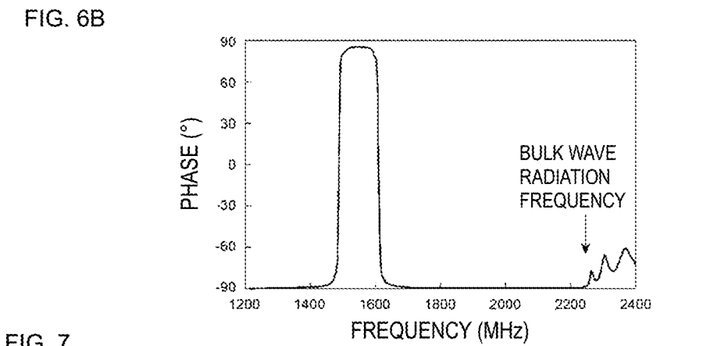

On the other hand, an acoustic wave resonator having the ratio of the bulk wave radiation frequency to the resonant frequency of about 1.515 was produced with the following design parameters.

A piezoelectric substrate: 15° Y-cut X-propagation LiNbO$_3$ substrate

An IDT electrode: an electrode made of Pt, a Pt film thickness=about 0.095λ

A SiO$_2$ film thickness: about 0.30λ

FIGS. 6A and 6B show impedance characteristics and phase characteristics, respectively, of this acoustic wave resonator. The wavelength λ of a Love wave was about 1.790 μm. A resonant frequency of a Love wave response appears at about 1486 MHz. A bulk wave radiation frequency is about 2252 MHz. Thus, a frequency ratio, which is a ratio of the bulk wave radiation frequency to the resonant frequency, is about 1.515.

When the above acoustic wave resonator is used as the acoustic wave resonator of the reception filter for Band 11, the bulk wave radiation frequency is in a frequency range higher than the pass band of Band 1. Thus, a loss in the reception filter for Band 1 can be significantly reduced, and good filter characteristics can be obtained.

As described above, the ratio of the bulk wave radiation frequency to the resonant frequency of the main response of the acoustic wave resonator is preferably set to about 1.4 or more, and more preferably about 1.5 or more, for example.

In order to increase the frequency ratio, it is sufficient to use metal having a high density for the IDT electrode, and to increase a thickness thereof. Examples of such an electrode material preferably include Pt, Au, W, Ir, Ta, Mo, and Cu. In this case, the IDT electrode is preferably made of such a metal having a high density, but, as long as such metal is used as a main electrode material, electrode layers made of other metals may be laminated in or on the IDT electrode.

Here, the main electrode material is an electrode material mainly acting to excite an acoustic wave used in the IDT electrode, and is an electrode material occupying, for example, about 50% by weight or more of the entire metal of the IDT electrode.

When Pt, Au, W, or Ir film is used as the material of the IDT electrode, FIG. 7 to FIG. 10 show a relationship between a Pt film thickness, a Au film thickness, a W film thickness, or an Ir film thickness and the above frequency ratio.

Figure 7:
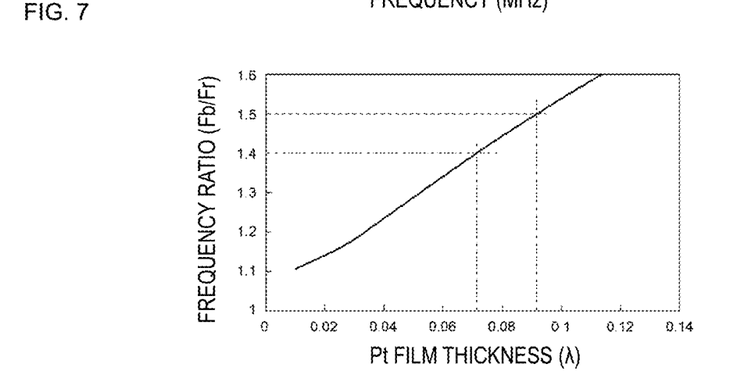
FIG. 7 is a graph showing a relationship between a film thickness of an electrode layer made of Pt of an IDT electrode, that is, a Pt film thickness, and a frequency ratio.
Figure 8:
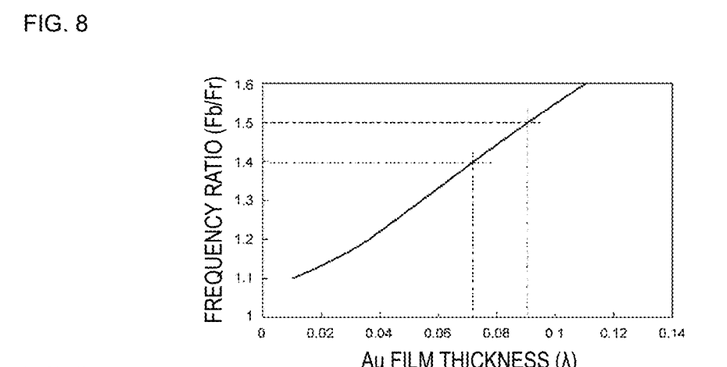
FIG. 8 is a graph showing a relationship between a film thickness of an electrode layer made of Au of an IDT electrode, that is, a Au film thickness, and a frequency ratio.
Figure 9:
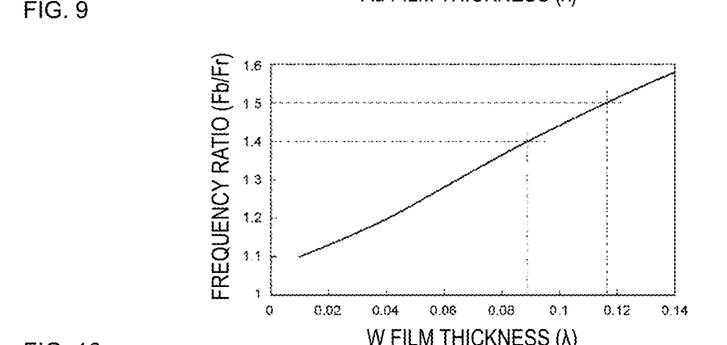
FIG. 9 is a graph showing a relationship between a film thickness of an electrode layer made of W of an IDT electrode, that is, a W film thickness, and a frequency ratio.
Figure 10:
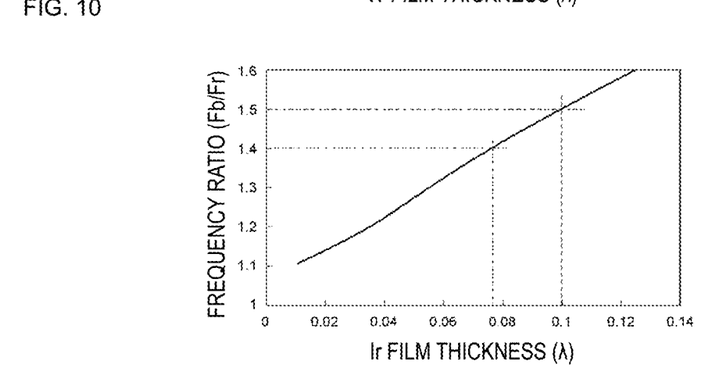
FIG. 10 is a graph showing a relationship between a film thickness of an electrode layer made of Ir of an IDT electrode, that is, an Ir film thickness, and a frequency ratio.

As is clear from FIG. 7, when Pt is used as the main electrode material, and the Pt film thickness is set to about 0.072λ or more, the above frequency ratio can be set to about 1.4 or more. In addition, it can be seen that the thickness with which the frequency ratio is about 1.5 or more is about 0.092λ or more. Similarly, as is clear from FIG. 8, when Au is used as the main electrode material, the frequency ratio of about 1.4 or more results from the Au film thickness of about 0.072λ or more, and about 1.5 or more results from about 0.090λ or more. As is clear from FIG. 9, when the main electrode material is W, the frequency ratio of about 1.4 or more results from the W film thickness of about 0.088λ or more, and about 1.5 or more results from about 0.116λ or more. As is clear from FIG. 10, when the main electrode material is Ir, the frequency ratio of about 1.4 or more results from the Ir film thickness of about 0.076λ or more, and about 1.5 or more results from about 0.10λ or more.

As described above, it is understood that the above frequency ratio can be set to about 1.4 or more, or about 1.5 or more, by correcting the film thickness according to the type of the main electrode material.

Figure 11:
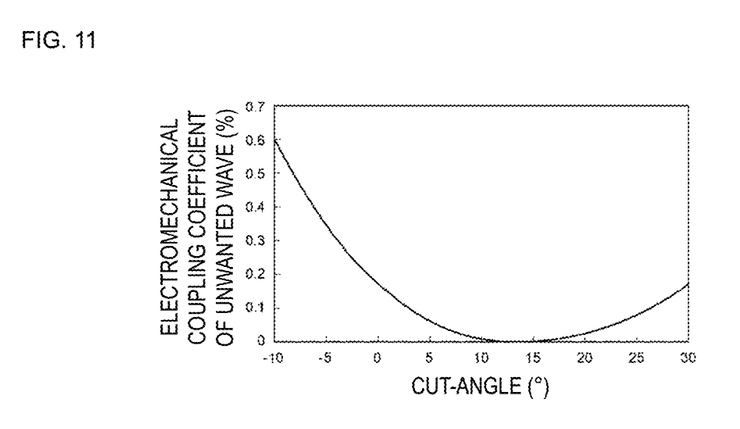
FIG. 11 is a graph showing a relationship between cut-angles in a Y-cut X-propagation $LiNbO_3$ substrate, and an electromechanical coupling coefficient of an unwanted wave.

FIG. 11 shows a relationship between cut-angles in a Y-cut X-propagation LiNbO₃ substrate, and an electromechanical coupling coefficient of an unwanted wave. Here, in the acoustic wave resonator using the Love wave, a spurious response due to excitation of a Rayleigh wave may occur in a vicinity of a band from a resonant frequency to an anti-resonant frequency, and the unwanted wave refers to the spurious response due to the Rayleigh wave.

As is clear from FIG. 11, changing the cut-angles changes the electromechanical coupling coefficient of the Rayleigh wave. Thus, the cut-angles are preferably set in a range from about 3° or more to about 26° or less, for example. In this case, the electromechanical coupling coefficient of the unwanted wave can be set to about 0.1% or less. When the LiNbO₃ substrate having the cut-angles in the range from, for example, about 3° or more to about 26° or less is used, deterioration in filter characteristics of the first filter can be reduced or prevented.

In the present specification, an orientation of LiNbO₃ used in the piezoelectric substrate is described as θ° rotated Y-cut X-propagation. This is expressed by Euler angles as (0°, θ−90°, 0°). Here, first and third Euler angles of 0° may be within a range from about −5° or more to about 5° or less. Here, even when a direction of a crystal axis of LiNbO₃ used in the piezoelectric substrate is an opposite direction, electrical characteristics are the same. Thus, a piezoelectric substrate using LiNbO₃ having Euler angles (0°, θ+90°, 0°) may be used. In this case, this is expressed by the cut-angles as (θ−180°) rotated Y-cut X-propagation.

Note that, in FIG. 1, the first filter 2 includes the series arm resonators S11 to S14 and the parallel arm resonators P11 to P13, but the number of resonators in the ladder filter is not limited thereto.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite filter device, comprising:
a piezoelectric substrate made of LiNbO₃;
a first filter on the piezoelectric substrate, and including a plurality of acoustic wave resonators; and
a second filter including one end connected in common to one end of the first filter; wherein
a pass band of the second filter is in a frequency band higher than a pass band of the first filter; and
bulk wave radiation frequencies of all of the plurality of acoustic wave resonators of the first filter are higher than the pass band of the second filter.

2. The composite filter device according to claim 1, wherein among the plurality of resonators of the first filter, in a resonator having a lowest resonant frequency, a ratio of a bulk wave radiation frequency to a resonant frequency is about 1.4 or more.

3. The composite filter device according to claim 1, wherein in all of the plurality of acoustic wave resonators of the first filter, a ratio of a bulk wave radiation frequency to a resonant frequency is about 1.4 or more.

4. The composite filter device according to claim 1, wherein
all of the acoustic wave resonators of the first filter include a same IDT electrode and is on the piezoelectric substrate;
the IDT electrode includes a plurality of electrode fingers, and a wavelength determined by an electrode finger pitch is λ; and
a main electrode material of the IDT electrode includes, as a main component, one of Pt, Au, W, Ir, Ta, Mo, or Cu.

5. The composite filter device according to claim 4, wherein the first filter includes a dielectric film covering the IDT electrode.

6. The composite filter device according to claim 4, wherein the main electrode material of the IDT electrode is Pt, and a thickness of an electrode layer made of the Pt is about 0.072λ or more.

7. The composite filter device according to claim 4, wherein the main electrode material of the IDT electrode is Au, and a thickness of an electrode layer made of the Au is about 0.072λ or more.

8. The composite filter device according to claim 4, wherein the main electrode material of the IDT electrode is W, and a thickness of an electrode layer made of the W is about 0.088λ or more.

9. The composite filter device according to claim 4, wherein the main electrode material of the IDT electrode is Ir, and a thickness of an electrode layer made of the Ir is about 0.076λ or more.

10. The composite filter device according to claim 1, wherein the piezoelectric substrate is an about 3° to about 26° rotated Y-cut X-propagation LiNbO₃ substrate.

11. The composite filter device according to claim 1, wherein in addition to the first filter and the second filter, at least one additional filter is connected in common to the first and second filters, and the pass band of the second filter is located on a highest frequency side among pass bands of the first, second, and at least one additional filters.

12. The composite filter device according to claim 1, wherein in addition to the first filter and the second filter, at least one additional filter is connected in common to the first and second filters, and the pass band of the first filter is lowest among pass bands of the first, second, and at least one additional filters.

13. The composite filter device according to claim 2, wherein in addition to the first filter and the second filter, at least one additional filter is connected in common to the first and second filters, and the pass band of the second filter is located on a highest frequency side among pass bands of the first, second, and at least one additional filters.

14. The composite filter device according to claim 2, wherein in addition to the first filter and the second filter, at least one additional filter is connected in common to the first and second filters, and the pass band of the first filter is lowest among pass bands of the first, second, and at least one additional filters.

15. The composite filter device according to claim 3, wherein in addition to the first filter and the second filter, at least one additional filter is connected in common to the first and second filters, and the pass band of the second filter is located on a highest frequency side among pass bands of the first, second, and at least one additional filters.

16. The composite filter device according to claim 3, wherein in addition to the first filter and the second filter, at least one additional filter is connected in common to the first and second filters, and the pass band of the first filter is lowest among pass bands of the first, second, and at least one additional filters.

17. The composite filter device according to claim 4, wherein in addition to the first filter and the second filter, at least one additional filter is connected in common to the first and second filters, and the pass band of the second filter is located on a highest frequency side among pass bands of the first, second, and at least one additional filters.

18. The composite filter device according to claim 4, wherein in addition to the first filter and the second filter, at least one additional filter is connected in common to the first and second filters, and the pass band of the first filter is lowest among pass bands of the first, second, and at least one additional filters.

* * * * *